United States Patent [19]
Joerg et al.

[11] Patent Number: 5,990,691
[45] Date of Patent: Nov. 23, 1999

[54] NON-INTRUSIVE STATE OBSERVATION OF VLSI CIRCUITS USING THERMAL ACTUATION

[75] Inventors: Werner Joerg, Edmonton; Arokia Nathan, Waterloo, both of Canada

[73] Assignee: University of Waterloo, Waterloo, Canada

[21] Appl. No.: 08/855,683

[22] Filed: May 14, 1997

Related U.S. Application Data

[63] Continuation of application No. 08/337,981, Nov. 14, 1994, abandoned.

[30] Foreign Application Priority Data

Nov. 12, 1993 [GB] United Kingdom .................... 9323417

[51] Int. Cl.$^6$ .................................................. G08B 21/00
[52] U.S. Cl. ........................................ 324/750; 324/763
[58] Field of Search ............................... 324/73.1, 158.1, 324/750, 765, 752, 753, 501, 133, 433, 555, 556; 374/43, 44; 437/8; 340/635, 653, 815.44, 663; 438/14, 17, 18; 702/57, 117

[56] References Cited

U.S. PATENT DOCUMENTS

| | | | |
|---|---|---|---|
| 4,020,414 | 4/1977 | Paredes | 324/133 |
| 4,684,884 | 8/1987 | Soderlund . | |
| 4,734,641 | 3/1988 | Byrd, Jr. et al. | 324/158.1 |
| 5,025,212 | 6/1991 | Gloanec et al. | 324/158.1 |
| 5,248,936 | 9/1993 | Nakata et al. | 324/73.1 |
| 5,270,655 | 12/1993 | Tomita | 324/501 |
| 5,302,022 | 4/1994 | Huang et al. | 374/44 |
| 5,359,285 | 10/1994 | Hashinaga et al. | 324/158.1 |
| 5,457,400 | 10/1995 | Ahmad et al. | 324/763 |
| 5,570,035 | 10/1996 | Dukes et al. | 324/763 |
| 5,673,028 | 9/1997 | Levy | 324/555 |

*Primary Examiner*—Vinh P. Nguyen
*Attorney, Agent, or Firm*—Baker & Botts, LLP

[57] ABSTRACT

An integrated circuit is set forth including a plurality of circuit elements interconnected by conductors and at least one resistive element operably connected to a location within the circuit. Upon an event occurring at the location, such as the activation of a circuit element, current is passed through the resistive element thereby elevating the temperature of the resistive element to cause incandescence so as to permit optical detection of the event.

17 Claims, 3 Drawing Sheets

NON-INTRUSIVE STATE OBSERVATION OF VLSI CIRCUITS USING THERMAL ACTUATION

This is a continuation of application Ser. No. 08/337,981, filed Nov. 14, 1994, entitled: Non-Intrusive State Observation Of VLSI Circuits Using Thermal Actuation, now abandoned.

The present invention relates to a method and apparatus for observing in situ the activation of predetermined functions or combinations thereof on VLSI circuits.

Traditionally, observing activities on VLSI circuits has been achieved by adding event reporting logic and transmission logic through existing or dedicated pins, or by incorporating probing pads. In this disclosure, the term "event" refers to the beginning or end of an activity. Traditional event reporting logic, however, may interfere with the progress of on-chip activities as the operation of reporting logic must also be considered in the timing of the chip. Transmission logic through existing pins requires some form of multiplexing, which may interfere with normal input/output activities, and dedicated pins limit the number of possible observation points.

To avoid the disadvantages of such interferences, chips are sometimes operated in different modes (for example normal execution and testing), which alters timing conditions and therefore may prevent observation of and tracing of time based problems. Moreover, since event reporting must be sequentialized through pins, no true observation of asynchronous or parallel events is possible.

Probing pads do overcome most of these limitations although they also require driving logic. They are however subject to electrical placement restrictions, and the physical and electrical properties of the probes (needles or membrane) limit the possible miniaturization of the probing pads and the range of signals that they can detect.

For both existing techniques, signal evaluation usually requires substantial additional off-chip hardware and software, especially if phenomenological assessment is required, rather than detailed event analysis.

It is therefore an object of the present invention to provide a method and apparatus in which the above disadvantages are obviated or mitigated.

In general terms, the present invention provides resistive electrical elements within the integrated circuit that are connected to selected locations within the circuit. Upon an event occurring at the location, for example, the activation of a circuit element, current is passed through the resistive elements whose temperature is elevated. The increased temperature may then be detected, either by imaging, either visible or infrared, or by on chip detectors whose output may be monitored in parallel to chip operation.

Preferably, the resistive electrical elements are thermally isolated from the body of the VLSI and, as a further preference, are integrally formed with the VLSI and separated from the substrate of the VLSI by micro-machining.

The preferred embodiments of the method and apparatus of the present invention addresses the above disadvantages in a number of ways. The apparatus does not interfere with on-chip activities, nor with normal input/output activities. Additional pins are not required, with the possible exception of one or two pins for optional separate power supply, nor is it necessary to adopt different operating modes. In addition, it is feasible to observe a large number of activities simultaneously, and a qualitative evaluation can be performed visually through infrared imaging without additional off-chip hardware or software. The evolution of the overall chip state is presented as a dynamic pattern of grey-scaled (in fact, variable levels of temperature, that is, degrees of infrared radiation) dots at the surface of the chip. It is also feasible to trace individual activations to assess qualitatively the frequency and duration of single or multiple activations, and to monitor the dynamic evolution of the overall state, or groups of states, as determined by such activities. The events to be observed are selected during the chip design phase.

With an external power supply, this visualization may be turned off or on, as required, without affecting the actual chip operation, and the visibility range of the patterns can be scaled to emphasize or de-emphasize various types of signals. Given enough power, the dots can be made to glow in the range of visible light, and for this reason, the resistive elements will be referred to herein as "microlamps". Although currently available, VLSI materials are not optimized for operation in visible light, and as such exhibit deficiencies in durability, repeatability and heat dissipation, in principle as materials are developed observation of visible light may be possible.

Accordingly, the present invention allows the observation and evaluation processes to be entirely external and to proceed without interfering with chip activity. As well, the method and apparatus of the present invention is compatible with commercial VLSI production processes.

The present invention is based on thermal/radiative effects in electronic circuit materials that in the preferred embodiments are suitably isolated thermally using silicon micro-machining (anisotropic etching). The micro-machining process is required to the realization of thermal radiators or microlamps as described in C. H. Masterangelo and R. S. Muller, "Vacuum-Sealed Silicon Micro-Machined Incandescent Lamp" in IEDM Tech. Dig., (Washington, D.C.), December 1989, pp. 19.4.1–19.4.4. As well, the micro-machining process is fully compatible with VLSI technologies without the requirement of additional masks (M. Parameswaran, A. M. Robinson, D. L. Blackburn, N. Gaitan, and J. Geist, "Micromachined Thermal Radiation Emitter from a Commercial CMOS Process" IEEE Electron Device Letters, Vol. 12, pp. 57–59, 1991). The essential characteristics of the manufacturing process of these microlamps and their operation are described below.

An embodiment of the present invention will now be described by way of example only with reference to the accompanying drawings, in which FIG. 1 is a schematic representation of a portion of an electrical circuit to be embodied in a VLSI circuit;

Figure 1:
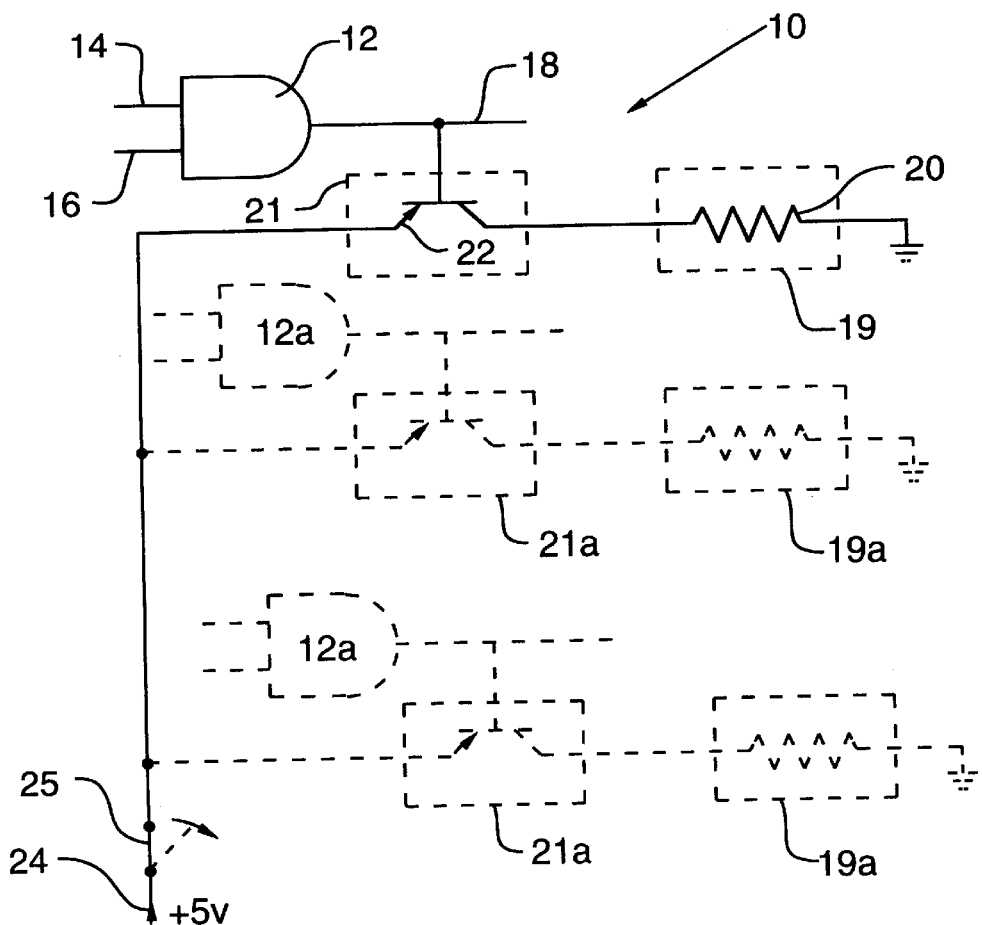

Referring therefore to FIG. 1, an electrical circuit 10 includes an AND gate 12 having inputs 14,16 and an output 18. Inputs 14,16 receive signals from associated circuit elements, shown in ghosted outline as 12a and the logical sum is provided by output 18 to additional circuit elements (not shown).

To monitor the output 18, microlamps 19,19a are associated with selected circuit elements at selected locations. Each microlamp 19,19a comprises a resistive element 20 which is associated with the output 18 respective of circuit elements 12 through a switch 21, in this case a transistor 22.

The transistor 22 controls current from an external power source 24 that is connected through the resistive element 20 to ground. The source 24 may be disabled by on-off switch 25 to inhibit operation of each of the microlamps 19,19a.

It will be appreciated that as the output 18 is activated by application of signals at inputs 14,16, the transistor 22 is enabled to allow current to pass through the element 20 and cause its temperature to rise. By observing the change in temperature of the element 20, an indication of activation of the output 18 can be obtained.

The circuit 10 of FIG. 1 is provided purely to illustrate the general principles of operation and it will be appreciated that this principle may be applied in complex integrated circuit designs at selected locations as required. Similarly, although an external power source is shown and a switch 21 is used to control current to the element 20, it is feasible to connect the element 20 directly to the output 18 of the associated circuit element of the associated circuit element. However, the use of a switch is preferred.

The circuit elements including AND gate 12 are of course implemented in VLSI circuit architecture and manufactured by conventional techniques.

The microlamp 19 including resistive element 20 is also manufactured by VLSI techniques as will be explained more fully below.

Figure 2:
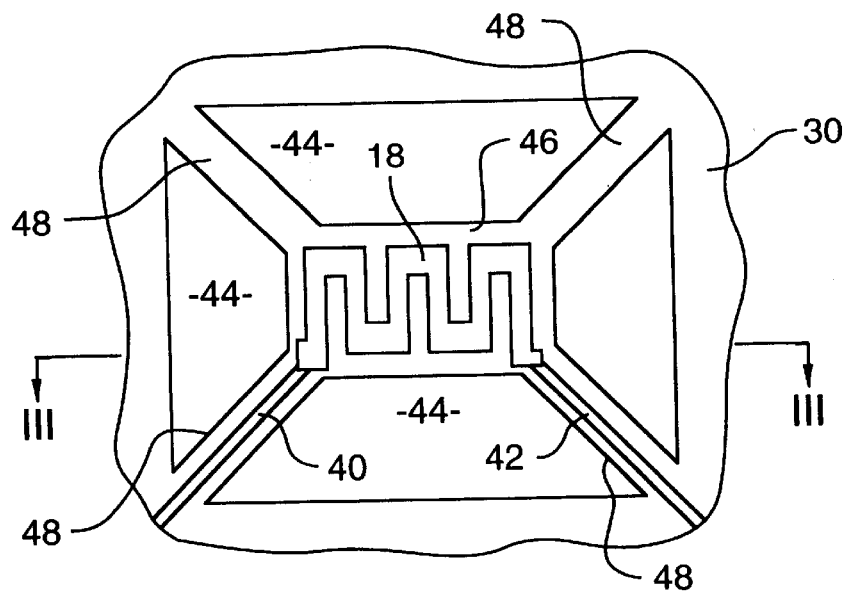
FIG. 2 is a plan view of a heating element formed on the VLSI.
Figure 3:
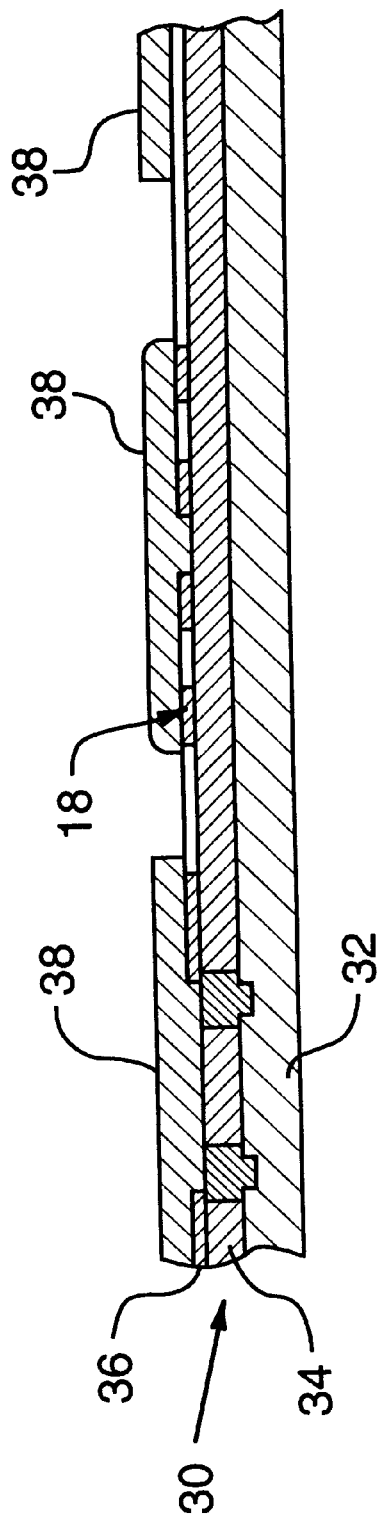
FIG. 3 is a section in the line III—III of FIG. 2 prior to micro-machining.
Figure 4:
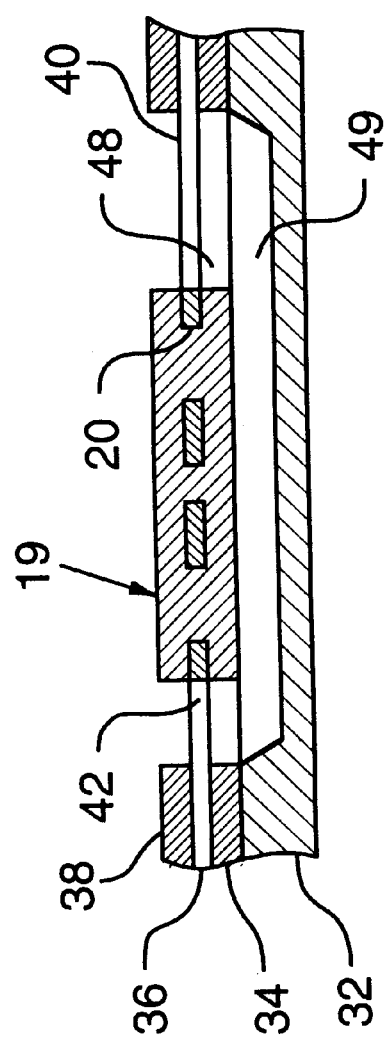
FIG. 4 is a view on the line III—III after micro-machining.

Referring therefore to FIGS. 2 and 3, an integrated circuit 30 is fabricated using conventional manufacturing techniques. The exact details of fabrication are well known and will vary according to the type of circuit to be implemented. In general terms, however, the integrated circuit 30 has a silicon substrate 32 and a silicon dioxide layer 34 carrying an array of metal conductors 36. Microlamp 19 is formed on a predefined region of the integrated circuit 30 with resistive element 20 being formed as a separate path of polysilicate deposited on the dioxide layer 34. The conductors 36 and element 20 are covered by a passivating layer 38 to inhibit further oxidation.

As can best be seen in FIG. 2, electrical power is provided to the element 20 by a pair of conductors 40,42 which form part of the array of conductors 36 and are connected to an external power source through suitable control logic as described above. During manufacture, the passivation layer 38 is inhibited adjacent to the region defining the microlamp 19 to provide four unprotected trapezoidal areas 44 surrounding a rectangular support area 46. The areas 44 are separated by passivated legs 48 that extend between the rectangular support area 46 and the passivated marginal region 50 of integrated circuit 30. The conductors 40,42 are supported on respective ones of the legs 48.

Conventional micro-machining techniques are then employed to remove the silicon substrate in the areas 44 and beneath the rectangular support area 46 so as to leave microlamp 19 thermally isolated from the substrate 32.

Integration of the microlamp 19 with control electronics on the same integrated circuit 30 requires a fabrication process that is fully compatible with that of the circuitry. In particular, the use of a VLSI process is highly desirable. The resistive elements 20 can be realized with a commercial CMOS process by use of design/layout techniques with standard design rules supplied by the foundry. Further, there is no requirement of additional masks for the micromachining process step. The key feature in the design approach is the superimposition of the active area, contact cut, and pad opening layers that are available in the given process. This leads to exposure of the <100> silicon substrate at the desired areas upon completion of, for example, the CMOS fabrication run. The heating element 20 is a resistor defined by the polysilicon layer and is fully encapsulated by thermal grown and chemical vapour deposited (CVD) oxides. The encapsulation serves to prevent oxidation of the polysilicon resistor at high temperatures thus increasing its lifetime. In the layout, the long edges of the superimposed features defining the areas 44 should be either parallel or perpendicular to the primary flat of the wafer (or the scribe channels of the integrated circuit chip). This is to minimise undercutting of the edges, that define the thermal isolation region, during micro-machining.

Typically this micro-machining is performed by immersing the integrated circuit 30 in an anisotropic etch solution (typically potassium or ammonium hydroxide an ethylene-diamene-pyrocatechol and pyrazine mixture at 100° C.) which preferentially etches the exposed silicon, which is of <100> orientation, leaving behind etch resistant <111> planes. The latter etchant is preferred, however, since its attack on the aluminium bonding pads is minimal when the temperature of the etch solution is about 100° C. The anisotropy in etching is due to the different etch rates in different crystal orientations. With EDP at that temperature, the etch rate of silicon in the <100> direction is about 1 $\mu$m, whilst in the <111> direction, it is slower by approximately a factor of 40. This creates a truncated pyramidal pit 49 with <111> sidewalls leaving the sandwiched polysilicon heating element 20 suspended over the pit. The etching of silicon underneath the membrane is made possible by the convex corners that define the active membrane. These corners get rounded continuously by the relatively high convex corner etch rate until all the silicon beneath is removed leaving a flat truncation. The resulting free standing structure, by virtue of its thermal isolation, has minimal conductive heat loss to the silicon substrate 32 thus allowing the resistive element to reach very high temperatures. The masking material for the etching process is the passivation oxide layer 38 whose etch rate is 14 A/min thus protecting functional circuit elements in the rest of the chip area. A maximum etch of an hour creates a suspended composite membrane containing a fully passivated resistive element 20 which is electrically connected to the conductors 36 and supported on legs 48.

The thermal isolation of the element 20 from the relatively massive substrate 32 ensures that temperature of the element 20 will be elevated at reasonable current levels and that such changes may be detected. The removal of the substrate 32 provides a spacing of between 20 and 30 $\mu$m between the element 20 and the surrounding substrate which provides adequate thermal isolation. If preferred, a thermally insulating material may be placed between the substrate and resistive element to inhibit heat transfer and provide increased mechanical support.

By careful selection of the etch composition, temperature and stirring conditions, very reproducible microlamps of high mechanical integrity are realised at a wafer level with minimum damage done to other layers of the chip, thus not compromising the electrical performance of the rest of the chip circuitry.

For a 100 $\mu$m×100 $\mu$m thermally isolated microlamp, an input power of 5 Mw can result in temperatures of around 600° C.–800° C., well contained in the area 46. The size of the microlamps can be suitably scaled down to reduce input power and silicon size requirements. The radiation emitted is mainly in the infrared range (wavelengths ranging from about 1 $\mu$m to about 13 $\mu$m). However, by increasing the input power, the red component of the radiation becomes sufficiently intense to become optically visible. Further increase in input power can, however, irreversibly change the state of the microlamp material, resulting in a sensitivity shift, thereby requiring the device to be subsequently recalibrated for grey-level detection. Damage to the heating element by oxidation (rusting) is minimal because of its encapsulation by passivation layers.

Although the thermal time constant is of the order of milliseconds (that is, frequency f is in the range of Khz), high frequencies are not a limitation since the input frequency to the microlamp 19 can be monitored by measuring infrared output on a grey scale. Because of the relatively constant amplitude of current in the integrated circuit 30, it has been found that the intensity of infrared radiation is proportional to the frequency of activation. Also, testing has shown that the microlamps 19 can be excited continuously for more than 2 weeks at relatively low lamp temperatures (from about 300° C. to about 400° C.), with less than 20% change in electrical behaviour i.e. resistance change.

In operation, activity in a VLSI circuit is determined by the presence or absence of power ($V_{DD}$) at specific locations of the circuit. By associating a microlamp 19 with each position to be monitored, an event may be used to enable or disable a transistor driving a microlamp. By monitoring the overall pattern provided by the microlamps the operation of the integrated circuit 30 may be observed and problems identified. If desirable, the events may be logically combined to activate an associated microlamp and thereby provide an indication of the overall function of an area of the chip rather than individual circuit elements although such combination may itself introduce timing complexity.

Microlamps may be placed anywhere on a chip. To minimize the impact on routing complexity, it is preferable that they are positioned as close as possible to the origin of their signal (for example, as an integral part of a cell). Wherever the microlamps are placed, they may conventionally form a geometric pattern at the surface of the chip. This pattern provides the foundation for the visual observation and the qualitative assessment of the operation of the chip. Depending on the operating state of the chip, dynamic patterns of infrared lights with varying intensity appear on the chip surface. These patterns of infrared lights relate directly to areas of activity and types of signals.

The use of an external power source permits control of the "sensitivity" of the microlamps. Thermal feedback can be used to control the power applied to the microlamps, in particular, to limit heat generation with increasing external power.

Figure 5:
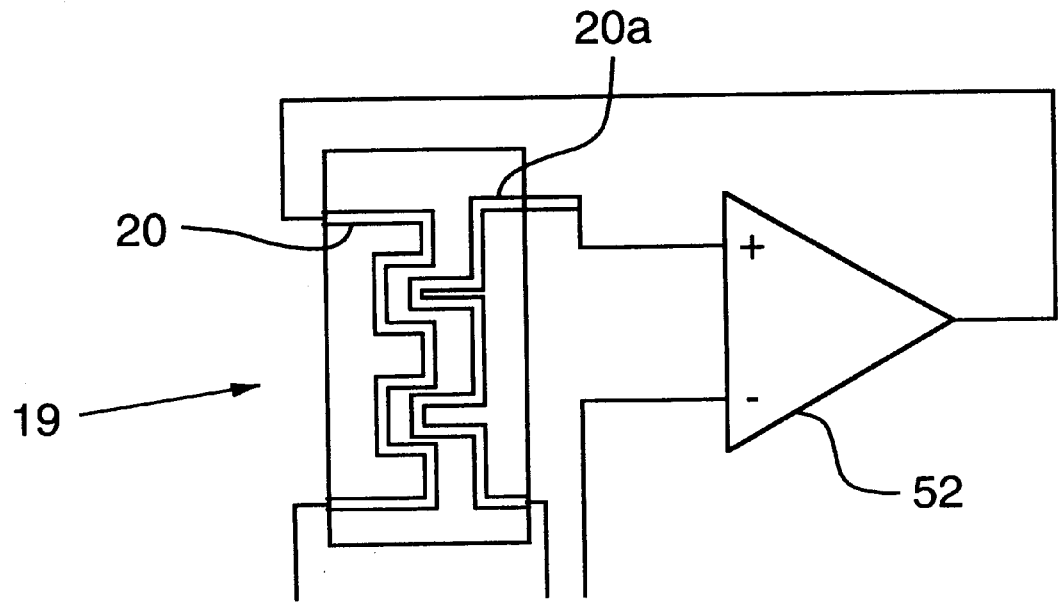
FIG. 5 is a schematic representation of a control used with the heating element of FIG. 2.

The thermal feedback may be added as shown in FIG. 5, by integrating a sensing element 20*a* in the form of a polysilicon resistor in close proximity to the polysilicon resistive element 20, with minimal change in the total lamp area. The sensing element 20*a* is a resistor of complementary shape to resistive element 20 and rested with it to minimise surface area. The output from the resistive sensor 20*a*, whose resistance varies with temperature and serves as a measure of the lamp temperature, can be suitably processed via feedback circuitry 52 incorporated into the circuit to control the input power microlamp 19.

Figure 6:
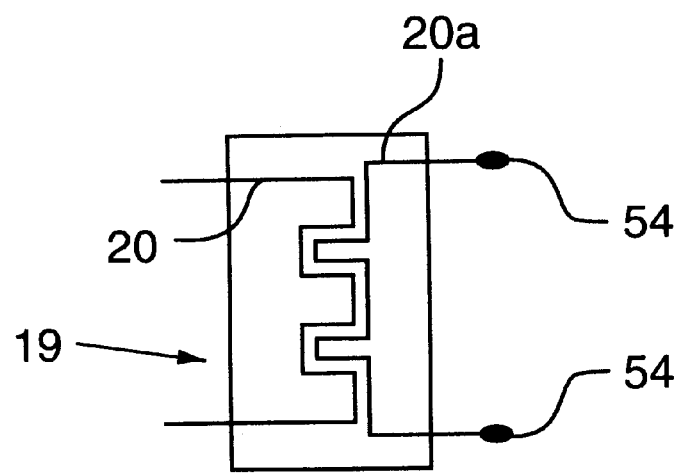
FIG. 6 is an alternative arrangement to FIG. 5.

Alternatively, as shown in FIG. 6, the change in resistance of the element 20*a* may itself be measured through external pins 54 to provide an indication of activity on the integrated circuit 30.

Microlamps 19 can be attached to any logical combination of signals identifying "on" or "off" events, but in order to light a microlamp, that is bring it above a minimal temperature threshold $T_t$, a minimum power must be applied to it. The power is determined by the integration of the current flowing through the microlamp 19 over a unit of time. Accordingly three categories of signals can be effectively detected, namely:

(1) Steady State Signals (that is, on/off time >> x $\mu$s) manifest as steady temperature (>> $T_t$) after an initial heating up period, or, alternatively, as ambient temperature after x $\mu$s turn-off time;

(2) Periodic Signals manifest as variable temperature, depending on the level of the power integral (frequency and duration of the on-event) above the temperature threshold $T_t$; and (3) Aperiodic Bursts are a possibly irregular combination of steady state and periodic signals. They manifest as aperiodic variations of temperature, subject to the power integral generated by each burst and the time delay (>> x $\mu$s) between subsequent bursts. During the chip design process, the power level supplied to each individual microlamp may be used to scale the anticipated frequency range of the periodic signals for the aperiodic bursts to the "detectable" range of the microlamp. Using the controlling capability of the thermal feedback, different signal ranges (and therefore different patters) are made "detectable", and burnout through excessive power is prevented.

Two different analysis methods may be used for the interpretation of the light patterns produced by the microlamps 19. The first is holistic (or analog) analysis whereby the patterns are considered in their entirety and their dynamic or steady state appearance can be used for qualitative assessment of the overall activity on the chip. Such interpretations may be done visually, and thus they allow quick identification of deviations from "normal" operating states or patterns. The human eye is particularly well suited for holistic analysis, and therefore this method typically requires minimum optical amplification. The flexibility of placement of the microlamp 19 permits grouping of the lamps associated with particular events to facilitate detection of the event or its absence. Although interrelated components may be physically remote from one another, the microlamps associated with them may be grouped together to provide a readily discernible change in pattern as an event occurs.

The second analysis method is the detailed (or digital) analysis wherein small regions or individual lights are monitored to trace particular problems. Stronger optical tracing (for example, high speed infrared imaging) is a useful complement to this method of analysis.

The method and apparatus of the present invention is therefore useful in both the areas of testing and of run time inspection. As well, the present invention is also useful in the area of prototype development.

In the area of chip testing, a productivity gain can be expected by using the method and apparatus of the present invention. That is, the present invention allows cheaper and faster identification of defective chips by applying holistic analysis for fast visual inspection of the overall functionality of a chip before executing conventional, time consuming test sequences on the chip. One of the greatest benefits of the present invention is achieved with a detailed analysis which permits a problem area to be detected directly on the chip layout, rather than feeding elaborate test sequences for deductive or inductive derivation of functional errors, as had been done previously.

In respect of run time inspection, VLSI chips augmented with microlamps 19 as provided in the present invention can be observed visually (by the human eye) or optically (by other computing equipment) to provide an external, independent assessment of the functionality, low characteristics and anomalies through holistic analysis. By feeding the power externally to the microlamps and using thermal feedback, the sensitivity of the microlamps can be controlled and inspection may be turned off or on, as required, without affecting the chip's operation.

In terms of prototype development, the present invention provides a new method and apparatus to observe and analyze, without interference, repetitive, true asynchronous and parallel behaviours on a chip. Individual events, as well as dynamic evolution, can be visualized. The present invention, therefore, encourages and promotes the development of novel prototype chips (for example, asynchronous, self-timed, parallel chips) through the new testing strategies.

In summary the present invention provides a novel method and apparatus that permits the in situ observation of activities and events on VLSI circuits, without interfering with the chip's activities. Microlamps are placed on the chip that create a pattern of infrared lights indicating the area of activity and types of signals. Alterations and modifications are possible within the scope of this invention.

We claim:

1. An integrated circuit comprising a plurality of circuit elements interconnected by conductors and at least one resistive element operably connected to a location within the circuit, sad resistive element being switchably connectable to a current source upon occurrence of an electrical event at said location, said current source when connected thereby elevating the temperature of said resistive element so as to cause incandescence during the duration of said event so as to permit optical detection of said event and of its cessation.

2. An integrated circuit according to claim 1 wherein said resistive element is thermally isolated.

3. An integrated circuit according to claim 2 wherein said resistive element is maintained in spaced relationship from a substrate of said integrated circuit.

4. An integrated circuit according to claim 3 wherein said substrate adjacent to said resistive element is removed after deposition of said resistive element thereon.

5. An integrated circuit according to claim 1 wherein current to said resistive element is controlled by a switch receiving an input signal from said location.

6. An integrated circuit according to claim 1 wherein current flowing to said resistive element is modulated in response to variations in the temperature of said element.

7. An integrated circuit according to claim 6 wherein a sensing element is disposed adjacent to said resistive element, variations in the temperature of said resistive element causing a corresponding change in the electrical characteristics of said sensing element to modulate the current supplied to said resistive element.

8. An integrated circuit according to claim 7 wherein said sensing element is a resistor of complementary shape to said resistive element and nested therewith.

9. An integrated circuit according to claim 8 wherein current supplied to said resistive element is modulated by circuit elements of said integrated circuit.

10. An integrated circuit according to claim 5 wherein said switch controls current supplied from an external source.

11. An integrated circuit according to claim 10 wherein said external source may be disabled to inhibit operation of said resistive element upon sensing of an event.

12. An integrated circuit according to claim 1 wherein plurality resistive elements are associated connected to respective selected locations to provide a discernible pattern upon operation of said circuit.

13. A method of monitoring electrical operation of an integrated circuit having a plurality of interconnected circuit elements comprising the steps of (i) operably connecting a resistive element to selected locations of said circuit and passing a switchable current through said resistive element, upon and during the duration of an electrical event at said location to elevate the temperature of said resistive element causing incandescence and (ii) observing the incandescence caused by said elevated temperature and the cessation of incandescence caused by a switching off of said current upon cessation of said event.

14. A method according to claim 13 including the step of actuating a switch upon occurrence of an event to connect a current source to said resistive element.

15. A method according to claim 13 wherein a plurality of resistive elements are arranged in a geometric pattern on said integrated circuit and operation is monitored by observing said pattern.

16. A method according to claim 13 wherein the temperature of said resistive element is monitored as an indication of frequency of occurrence of an event at a selected location.

17. A method according to claim 13 wherein current supplied to said resistive element is modulated as the temperature of said resistive element varies.

* * * * *